US011809085B2

(12) United States Patent
Stiepan et al.

(10) Patent No.: US 11,809,085 B2
(45) Date of Patent: Nov. 7, 2023

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Hans Michael Stiepan, Aalen (DE); Toralf Gruner, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/555,573

(22) Filed: Dec. 20, 2021

(65) Prior Publication Data

US 2022/0113634 A1  Apr. 14, 2022

Related U.S. Application Data

(63) Continuation of application No. PCT/EP2020/065938, filed on Jun. 9, 2020.

(30) Foreign Application Priority Data

Jun. 19, 2019  (DE) .......................... 102019208934.8

(51) Int. Cl.
*G03F 7/20* (2006.01)
*G03F 7/00* (2006.01)
(Continued)

(52) U.S. Cl.
CPC .......... *G03F 7/70316* (2013.01); *C03C 17/10* (2013.01); *G02B 5/0891* (2013.01);
(Continued)

(58) Field of Classification Search
CPC ............... G03F 7/70316; G03F 7/7015; G03F 7/70266; G03F 7/702; G03F 7/70958;
(Continued)

(56) References Cited

U.S. PATENT DOCUMENTS 10,908,509 B2  2/2021 Lippert et al.
2014/0285783 A1* 9/2014 Dinger ................ G02B 5/0891
359/359
(Continued)

FOREIGN PATENT DOCUMENTS

DE  10 2011 005 940 A1  9/2012
DE     102011081603 A1  10/2012
(Continued)

OTHER PUBLICATIONS

GPTO—Office Action with English translation, for Application DE 10 2019 208 934.8 dated Jan. 28, 2020, 6 pages.
(Continued)

*Primary Examiner* — Mesfin T Asfaw
(74) *Attorney, Agent, or Firm* — Edell, Shapiro & Finnan, LLC

(57) ABSTRACT

A microlithographic projection exposure mirror has a mirror substrate (12, 32), a reflection layer system (21, 41) for reflecting electromagnetic radiation that is incident on the mirror's optical effective surface, and at least one piezoelectric layer (16, 36), which is arranged between the mirror substrate and the reflection layer system and to which an electric field for producing a locally variable deformation is applied by a first electrode arrangement situated on the side of the piezoelectric layer facing the reflection layer system, and by a second electrode arrangement situated on the side of the piezoelectric layer facing the mirror substrate. One of the electrode arrangements is assigned a mediator layer (17, 37, 51, 52, 53, 71) for setting an at least regionally continuous profile of the electrical potential along the respective electrode arrangement. The mediator layer has at least two mutually electrically insulated regions (17a, 17b, 17c, . . . ; 37a, 37b, 37c, . . . ).

22 Claims, 10 Drawing Sheets

(51) Int. Cl.
  *C03C 17/10* (2006.01)
  *G02B 5/08* (2006.01)
  *G02B 26/08* (2006.01)

(52) U.S. Cl.
  CPC ....... *G02B 26/0858* (2013.01); *G03F 7/7015* (2013.01); *G03F 7/70266* (2013.01)

(58) Field of Classification Search
  CPC .. C03C 17/10; G02B 5/0891; G02B 26/0858; G02B 26/0825
  See application file for complete search history.

(56) References Cited

U.S. PATENT DOCUMENTS

| | | |
|---|---|---|
| 2016/0209751 A1 | 7/2016 | Gruner et al. |
| 2018/0164581 A1 | 6/2018 | Hakvoort et al. |
| 2020/0026195 A1 | 1/2020 | Lippert et al. |
| 2020/0174379 A1 | 6/2020 | Wylie-Van Eerd et al. |
| 2021/0055662 A1 | 2/2021 | Hild et al. |

FOREIGN PATENT DOCUMENTS

| | | |
|---|---|---|
| DE | 10 2011 077 234 A1 | 12/2012 |
| DE | 10 2011 084 649 A1 | 4/2013 |
| DE | 10 2013 219 583 A1 | 4/2015 |
| DE | 10 2015 213 273 A1 | 1/2017 |
| DE | 10 2016 224 202 A1 | 1/2017 |
| DE | 10 2018 207 146 A1 | 11/2017 |
| DE | 10 2017 217 695 A1 | 6/2018 |
| DE | 102017203647 A1 | 9/2018 |
| DE | 10 2017 213 900 A1 | 2/2019 |
| DE | 10 2020 206 708 A1 | 12/2021 |
| WO | 2013057046 A1 | 4/2013 |
| WO | 2018177649 A1 | 10/2018 |

OTHER PUBLICATIONS

IPRP for PCT/EP2020/065938 dated Dec. 21, 2021, 9 pages.
International Search Report, PCT/EP2020/065938, dated Aug. 7, 2020, 2 pages.

\* cited by examiner

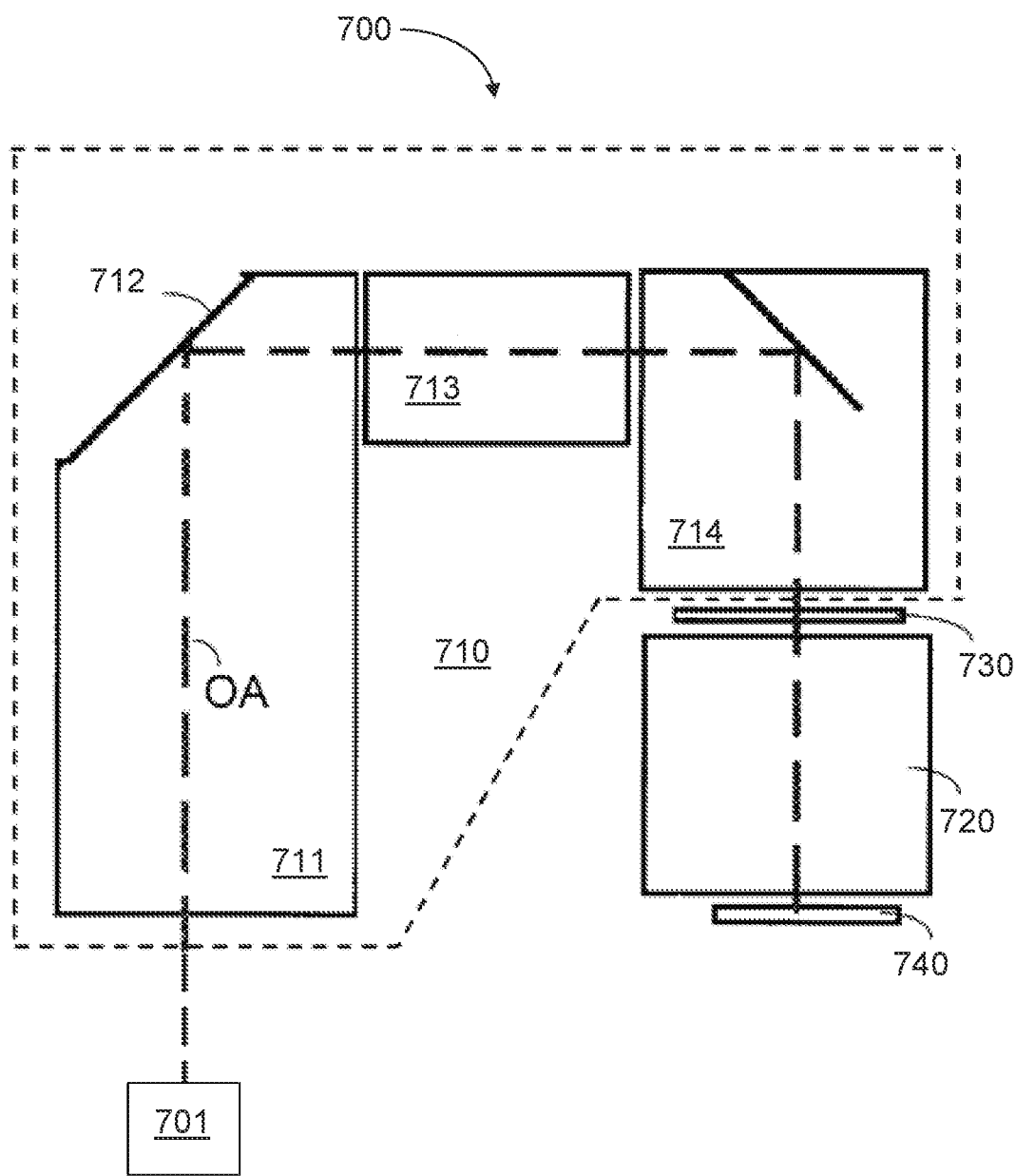

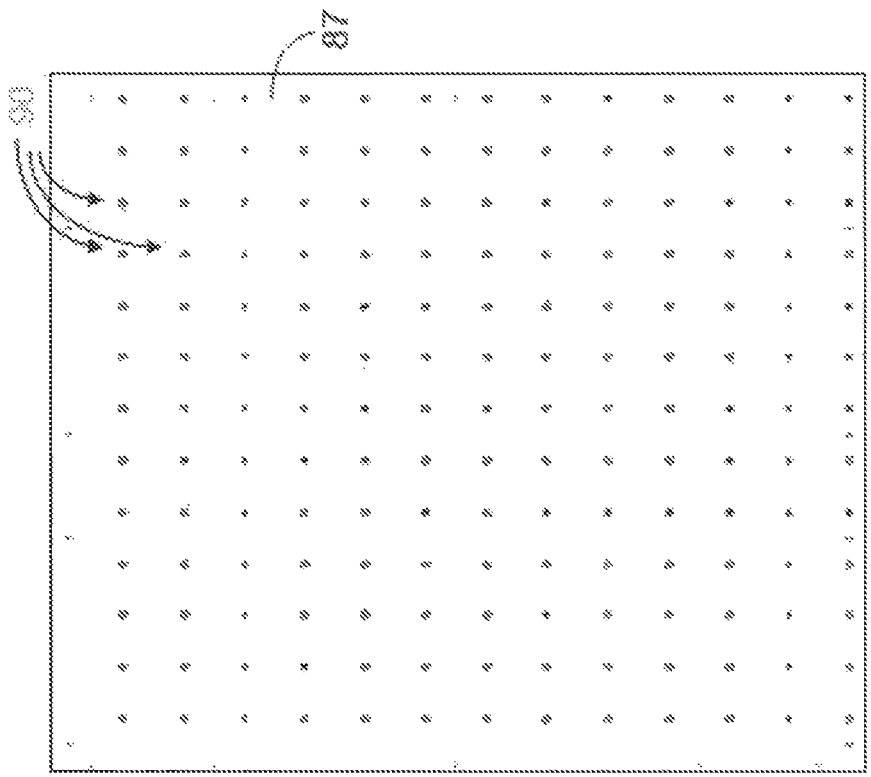
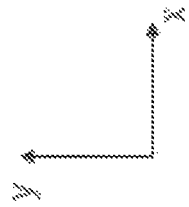
Fig. 8B
Prior art

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2020/065938, which has an international filing date of Jun. 9, 2020, and which claims the priority of German Patent Application 10 2019 208 934.8, filed Jun. 19, 2019. The disclosures of both applications are incorporated in their respective entireties into the present Continuation by reference.

FIELD OF THE INVENTION

The invention relates to a mirror, in particular for a microlithographic projection exposure apparatus.

BACKGROUND

Microlithography is used for producing microstructured components such as, for example, integrated circuits or LCDs. The microlithography process is conducted in a so-called projection exposure apparatus, which comprises an illumination device and a projection lens. The image of a mask (=reticle) illuminated with the illumination device is projected with the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process owing to the lack of availability of suitable light-transmissive refractive materials.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer system of the adaptive mirror also deforms, with the result that, for example, imaging aberrations (possibly also temporally variable imaging aberrations) can be at least partly compensated for by suitably driving the electrodes.

FIG. 8A shows a construction of a conventional adaptive mirror 80, which is possible in principle, in a merely schematic illustration. The mirror 80 comprises in particular a mirror substrate 82 and also a reflection layer system 91 and has a piezoelectric layer 86, which is produced from lead zirconate titanate ($Pb(Zr,Ti)O_3$, PZT) in the example. Electrode arrangements are respectively situated above and below the piezoelectric layer 86, by way of which electrode arrangements an electric field for producing a locally variable deformation is able to be applied to the mirror 80. Of said electrode arrangements, the second electrode arrangement facing the substrate 82 is configured as a continuous, planar electrode 84 of constant thickness, whereas the first electrode arrangement has a plurality of electrodes 90, to each of which an electrical voltage relative to the electrode 84 is able to be applied via a lead 89. The electrodes 90 are embedded into a common smoothing layer 88, which is produced e.g. from quartz ($SiO_2$) and serves for levelling the electrode arrangement formed from the electrodes 90. Furthermore, the mirror 80 has, between the mirror substrate 82 and the bottom electrode 84 facing the mirror substrate 82, an adhesion layer 83 (e.g. composed of titanium, Ti) and a buffer layer 85 (e.g. composed of $LaNiO_3$), which is arranged between the electrode arrangement 84 facing the substrate 82 and the piezoelectric layer 86 and which further supports the growth of PZT in an optimum, crystalline structure and ensures consistent polarization properties of the piezoelectric layer over the service life.

During operation of the mirror 80 or of an optical system comprising said mirror 80, applying an electrical voltage to the electrodes 84 and 90, by way of the resultant electric field, results in a deflection of the piezoelectric layer 86. In this way, it is possible—for instance for compensating optical aberrations owing e.g. to thermal deformations resulting from EUV radiation incident on the optical effective surface 81—to achieve an actuation of the mirror 80.

In accordance with FIGS. 8A-8B, the mirror 80 furthermore has a mediator layer 87. Said mediator layer 87 is in direct electrical contact with the electrodes 90 (which are illustrated in plan view in FIG. 8A only for explanatory purposes). Said mediator layer 87 serves to "mediate" between the electrodes 90 in terms of potential, wherein it has only low electrical conductivity, with the consequence that a potential difference existing between adjacent electrodes 90 is dropped substantially across the mediator layer 87.

An advantage achieved owing to the presence of the mediator layer 87 is evident from the diagram in FIG. 9, in which diagram the stray light proportion is plotted as a function of the number of electrodes 90. In accordance with FIG. 9, in order to fall below an upper threshold for the stray light proportion, said upper threshold being predefined according to an exemplary specification, without the presence of the mediator layer 87, in the example chosen, a number of sixty electrodes is required in one of two mutually perpendicular spatial directions, that is to say in total a number of 60*60=3600 electrodes, whereas if the mediator layer 87 is present, said number can be reduced to fewer than 10 electrodes in one of the two mutually perpendicular spatial directions. This has the consequence that the realizability of the electrode arrangement formed from the electrodes 90 is significantly simplified.

However, one problem that occurs in practice during the operation of the adaptive mirror described above is that even with the use of the mediator layer described above, the deformation profiles desired in each case can often be realized only to an insufficient extent. This has the consequence that the correction of imaging aberrations that is attained by driving of the electrodes is not achievable with sufficient accuracy.

A further problem that occurs in practice is that a setting of a comparatively high electrical sheet resistance of the mediator layer (of e.g. 100 k$\Omega$), which setting is desirable in principle in order to limit undesired evolution of heat on account of the electrical power generated in the mediator layer 87 as a result of electric current being applied to the electrode arrangements, has the effect that the propagation of the electrical potential in the mediator layer would take place too slowly in certain scenarios (e.g. upon taking account of thermally induced mask deformations in the lithography process). As a result, conventionally, when configuring the mediator layer, compromises must be made in order to harmonize the avoidance of thermal problems (by setting the highest possible electrical resistance of the mediator layer) with a rapid reaction capability (e.g. within milliseconds (ms)) when setting the desired surface shape of the adaptive mirror (by setting a correspondingly low electrical resistance of the mediator layer).

Regarding the prior art, reference is made merely by way of example to DE 10 2013 219 583 A1 and DE 10 2015 213 273 A1.

SUMMARY

It is an object of the present invention to provide a mirror, in particular for a microlithographic projection exposure apparatus, which, on the basis of the principle of the locally varying deformation of a piezoelectric layer, enables aberrations in an optical system to be corrected much better than before.

This and related objects are achieved in accordance with the novel structures and methods described and claimed herein.

A mirror according to one aspect of the invention comprises:
- an optical effective surface;
- a mirror substrate;
- a reflection layer system for reflecting electromagnetic radiation that is incident on the optical effective surface; and
- at least one piezoelectric layer, which is arranged between the mirror substrate and the reflection layer system and to which an electric field for producing a locally variable deformation is able to be applied by way of a first electrode arrangement situated on the side of the piezoelectric layer facing the reflection layer system, and by way of a second electrode arrangement situated on the side of the piezoelectric layer facing the mirror substrate;
- wherein one of said electrode arrangements is assigned a mediator layer for setting a continuous profile of the electrical potential along the respective electrode arrangement; and
- wherein said mediator layer has at least two mutually electrically insulated regions.

In the context of the present application, the term "reflection layer system" should be deemed to encompass both multilayer systems or reflection layer stacks and monolayers.

A primary concept underlying the present invention, in the case of an adaptive mirror comprising a piezoelectric layer, to which an electric field for producing a locally variable deformation is able to be applied by way of electrode arrangements, is, in particular, a concept which does not involve configuring in planar fashion throughout a mediator layer having comparatively low electrical conductivity for mediating in terms of potential between the respective electrodes of an electrode arrangement. Rather, it involves using a "structured mediator layer" in so far as, through suitable electrical insulation of individual regions of the mediator layer from one another, in each case only a partial number of electrodes of the electrode arrangement assigned to the relevant mediator layer are electrically connected to one another.

In other words, according to the invention, the mediator layer used for mediating in terms of electrical potential between electrodes of the relevant electrode arrangement is configured such that said mediating in terms of potential takes place only between subgroups or "clusters" of electrodes (e.g. only between adjacent electrodes or electrodes arranged at a comparatively small distance from one another), that is to say that a "remote interaction" between electrodes comparatively far away from one another across the mediator layer is interrupted.

In this case, the invention includes the consideration that such a "remote interaction" across the mediator layer in the sense of an electrical connection of all the electrodes of the associated electrode arrangement to one another, such as is present in the conventional adaptive mirror in accordance with FIGS. 8A-8B and as indicated in the schematic equivalent circuit diagram in FIG. 4A, undesirably has the consequence that the electrical voltage established between respectively adjacent electrodes on account of the action of the mediator layer is also influenced by electrodes further away. This results in a generally logarithmic drop in voltage to the average level of all the electrodes, which in turn contributes to the problem—outlined in the introduction—of an only inadequate approximation of the adaptive mirror to the deformation profile desired in each case.

In order to overcome this problem, then, the invention involves interrupting the remote interaction between the electrodes across the mediator layer with the consequence that the mediator layer structured according to the invention—as illustrated schematically in the equivalent circuit diagram in FIG. 4B—effects a mediation in terms of electrical potential e.g. only between respectively adjacent electrodes or electrodes arranged at a comparatively small distance from one another in the associated electrode arrangement. As a result, in the case of adjacent electrodes, a polynomial profile of the voltage between the electrodes is attained, in contrast to the logarithmic voltage drop described previously. As a result, the invention makes it possible to realize a significantly improved approximation to the desired deformation profile of the adaptive mirror.

According to the invention, in this case, with regard to the structuring of the mediator layer, an increased outlay is deliberately accepted from a production engineering standpoint in order, in return, by way of the suppression of a remote interaction in the mediation in terms of electrical potential between the electrodes, to achieve the improved approximation of the deformation profile to the target profile desired in each case.

A further advantage of the structuring of the mediator layer according to the invention is that the limitation according to the invention of the mediation in terms of electrical potential to electrodes that are comparatively closely adjacent (and typically at a similar electrical potential) results in a reduction of the electric currents flowing in total in the mediator layer (in comparison with the conventional mediation in terms of electrical potential between all the electrodes of the assigned electrode arrangement across a mediator layer configured in a continuous fashion). This in turn advantageously has the effect that the thermal problems—likewise mentioned in the introduction—and thus also the difficulties in setting a suitable compromise between "rapid reaction capability" of the adaptive mirror with regard to the respective deformation profile, on the one hand, and avoiding undesired thermal deformations, on the other hand, can be reduced.

In accordance with one embodiment, the electrode arrangement to which the mediator layer is assigned has a plurality of electrodes, to each of which an electrical voltage relative to the respective other electrode arrangement is able to be applied via a lead.

In accordance with one embodiment, the mediator layer is structured for providing a plurality of mutually electrically insulated regions, wherein said regions are assigned to different electrodes or different clusters of electrodes.

In accordance with one embodiment, this structuring makes possible an electric current flow across the mediator layer only between directly adjacent electrodes.

In accordance with one embodiment, this structuring makes possible an electric current flow across the mediator layer only between electrodes respectively associated with the same cluster.

In accordance with one embodiment, the number of electrodes in the respective clusters varies across the mediator layer.

In accordance with one embodiment, the mutually electrically insulated regions of the mediator layer are separated from one another by an electrically insulating material situated between said regions, in particular silicon dioxide ($SiO_2$) or $Al_2O_3$.

In accordance with one embodiment, the mutually electrically insulated regions of the mediator layer are separated from one another by a material having an electrical permittivity $\varepsilon_r$ of more than 1000.

In accordance with one embodiment, the mutually electrically insulated regions of the mediator layer are separated from one another by virtue of the fact that the piezoelectric layer extends between said regions.

In accordance with one embodiment, electrically insulating sections for separating the mutually electrically insulated regions, in a plane parallel to the piezoelectric layer, have a maximum dimension of less than 10 μm, in particular less than 2 μm.

In accordance with one embodiment, a shielding electrode for at least partly shielding the respective electrical potentials is in each case arranged between different electrodes or different clusters of electrodes.

In accordance with one embodiment, optionally a defined electrical voltage can be applied to said shielding electrode or the latter can be operated with zero voltage.

The invention furthermore relates to a mirror, in particular for a microlithographic projection exposure apparatus, wherein the mirror has an optical effective surface, comprising:
  a mirror substrate;
  a reflection layer system for reflecting electromagnetic radiation that is incident on the optical effective surface; and
  at least one piezoelectric layer, which is arranged between the mirror substrate and the reflection layer system and to which an electric field for producing a locally variable deformation is able to be applied by way of a first electrode arrangement situated on the side of the piezoelectric layer facing the reflection layer system, and by way of a second electrode arrangement situated on the side of the piezoelectric layer facing the mirror substrate;
  wherein one of said electrode arrangements is assigned a mediator layer for setting an at least regionally continuous profile of the electrical potential along the respective electrode arrangement;
  wherein the electrode arrangement to which the mediator layer is assigned has a plurality of electrodes, to each of which an electrical voltage relative to the respective other electrode arrangement is able to be applied via a lead; and
  wherein a shielding electrode for at least partly shielding the respective electrical potentials is in each case arranged between different electrodes or different clusters of electrodes.

In accordance with one embodiment, the material of the mediator layer is selected from the group containing titanium oxides, gallium nitrides, gallium oxides, aluminium nitrides, aluminium oxides and also mixed oxides comprising lanthanum (La), manganese (Mn), cobalt (Co), calcium (Ca), strontium (Sr), iron (Fe), copper (Cu) or nickel (Ni). The material of the mediator layer can be a stoichiometric or else a non-stoichiometric, a doped or else a non-doped compound. Exemplary suitable compounds or mixed oxides are, in particular, titanium dioxide ($TiO_2$), $LaCoO_3$, $LaMnO_3$, $LaCaMnO_3$, $LaNiO_3$, $La_{0.7}Sr_{0.3}FeO_3$, $LaCu_{0.4}(Mn_{0.5}Co_{0.5})_{0.6}O_3$, $La_{0.7}Sr_{0.3}MnO_3$, GaN, $Ga_2O_3$, AlN, $SrCoO_3$ or $CaMnO_3$.

In accordance with one embodiment, the mirror is designed for an operating wavelength of less than 30 nm, in particular less than 15 nm.

In accordance with one embodiment, a locally variable deformation is able to be produced by an electric field being applied to the piezoelectric layer such that the maximum deviation from a predefined desired profile is less than 2%.

In accordance with one embodiment, a distance between the optically used surface of the mirror and the mirror edge is less than 10 mm, in particular less than 3 mm. In such configurations of the mirror having an optically used surface extending close to the mirror edge, the setting of "edge-sharp" deformation profiles that is made possible according to the invention is manifested particularly to advantage in comparison with a mirror comprising an unstructured mediator layer.

In accordance with one embodiment, the mediator layer has an average electrical sheet resistance of less than 10 kΩ, in particular less than 5 kΩ. As a result, it is possible to attain a rapid reaction capability of the adaptive mirror with regard to the respective deformation profile, making use of the circumstance that, as already explained, on account of the reduction of the electric currents flowing in total in the mediator layer structured according to the invention (in comparison with the conventional mediation in terms of electrical potential between all the electrodes of the assigned electrode arrangement across a mediator layer configured in a continuous fashion), less consideration has to be given to avoiding undesired thermal deformations (for instance as a result of setting a high electrical resistance in the mediator layer).

In accordance with one embodiment, the mirror is a mirror for a microlithographic projection exposure apparatus.

The invention furthermore relates to an optical system of a microlithographic projection exposure apparatus, in particular an illumination device or a projection lens, comprising at least one mirror having the above-described features, and also to a microlithographic projection exposure apparatus.

The invention furthermore relates to a method for producing a mirror, wherein the method comprises the following steps:
  providing a mirror substrate;
  applying a piezoelectric layer and also a first and a second electrode arrangement on the mirror substrate, wherein an electric field for producing a locally variable deformation is able to be applied to the piezoelectric layer by way of the first electrode arrangement situated on the side of the piezoelectric layer facing away from the mirror substrate, and by way of the second electrode arrangement situated on the side of the piezoelectric layer facing the mirror substrate;

applying a mediator layer for setting an at least regionally continuous profile of the electrical potential along one of said electrode arrangements in such a way that said mediator layer has at least two mutually electrically insulated regions; and applying a reflection layer stack for reflecting electromagnetic radiation having an operating wavelength that is incident on the optical effective surface.

In accordance with one embodiment, the step of applying the mediator layer comprises structuring the mediator layer, wherein said structuring is carried out lithographically or using laser ablation.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 7 shows a schematic illustration depicting a possible construction of a microlithographic projection exposure apparatus designed for operation in the VUV;

FIGS. 8A-8B show schematic illustrations depicting a conventional construction of an adaptive mirror (FIG. 8A) and interactions between electrodes (FIG. 8B) in such a conventional construction.

DETAILED DESCRIPTION

Figure 1:
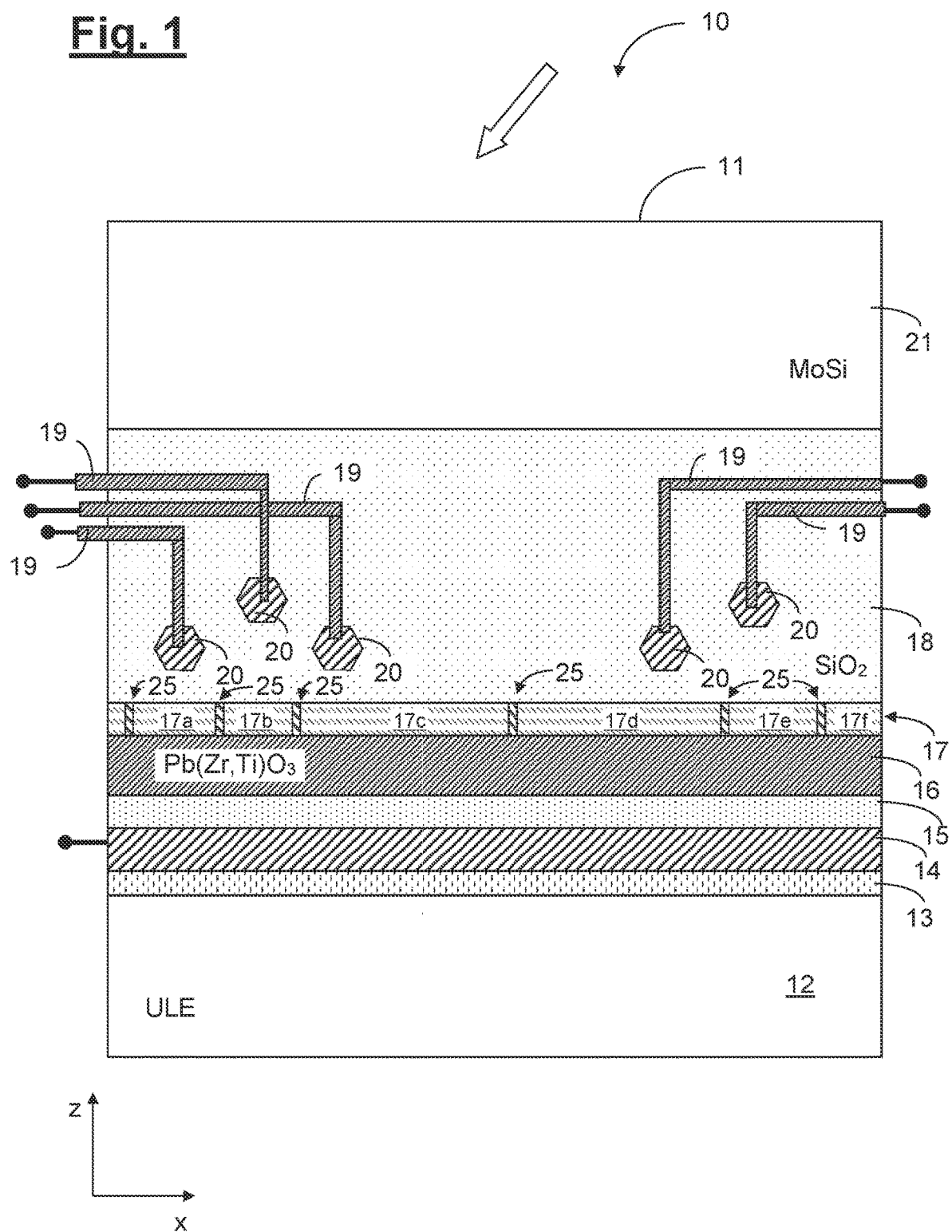
FIG. 1 shows a schematic illustration depicting the construction of an adaptive mirror in accordance with one embodiment of the invention.

FIG. 1 shows a schematic illustration for explaining the construction of a mirror according to the invention in one exemplary embodiment of the invention. The mirror 10 comprises in particular a mirror substrate 12, which is produced from any desired suitable mirror substrate material. Suitable mirror substrate materials are e.g. titanium dioxide ($TiO_2$)-doped quartz glass, wherein the materials sold under the trademark ULE® (from Corning Inc.) can be used, merely by way of example (and without the invention being restricted thereto). Further suitable materials are lithium aluminosilicate glass ceramics sold e.g. under the trademarks Zerodur® (from Schott AG) or Clearceram® (from Ohara Inc.). Particularly in applications outside EUV microlithography, other materials such as e.g. silicon (Si) are also suitable for consideration.

Furthermore, the mirror 10 has, in a manner known per se in principle, a reflection layer system 21, which, in the embodiment illustrated, comprises merely by way of example a molybdenum-silicon (Mo—Si) layer stack. Without the invention being restricted to specific configurations of said reflection layer system, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.3 nm. In further embodiments, the reflection layer system can also be a monolayer.

The mirror 10 can be in particular an EUV mirror of an optical system, in particular of the projection lens or of the illumination device of a microlithographic projection exposure apparatus.

The mirror 10 has a piezoelectric layer 16, which is produced from lead zirconate titanate ($Pb(Zr,Ti)O_3$, PZT) in the example. Electrode arrangements are respectively situated above and below the piezoelectric layer 16, by way of which electrode arrangements an electric field for producing a locally variable deformation is able to be applied to the mirror 10. Of said electrode arrangements, the second electrode arrangement facing the substrate 12 is configured as a continuous, planar electrode 14 of constant thickness, whereas the first electrode arrangement has a plurality of electrodes 20, to each of which an electrical voltage relative to the electrode 14 is able to be applied via a lead 19. The electrodes 20 are embedded into a common smoothing layer 18, which is produced e.g. from quartz ($SiO_2$) and serves for levelling the electrode arrangement formed from the electrodes 20. Furthermore, the mirror 10 has, between the mirror substrate 12 and the bottom electrode 14 facing the mirror substrate 12, an adhesion layer 13 (e.g. composed of titanium, Ti) and a buffer layer 15 (e.g. composed of $LaNiO_3$), which is arranged between the electrode arrangement 14 facing the substrate 12 and the piezoelectric layer 16 and which further supports the growth of PZT in an optimum, crystalline structure and ensures consistent polarization properties of the piezoelectric layer over the service life.

During operation of the mirror 10 or of an optical system comprising said mirror 10, applying an electrical voltage to the electrodes 14 and 20, by way of the electric field that forms, results in a deflection of the piezoelectric layer 16. In this way, it is possible (for instance for the compensation of optical aberrations e.g. owing to thermal deformations in the case of EUV radiation incident on the optical effective surface 11) to achieve an actuation of the mirror 10.

In accordance with FIG. 1, the mirror 10 furthermore has a mediator layer 17. Said mediator layer 17 is in direct electrical contact with the electrodes 20 (which are illustrated in plan view in FIG. 1 only for illustrative purposes), and serves to "mediate" between the electrodes 20 in terms of potential, wherein it has only low electrical conductivity, (preferably less than 200 siemens/meter (S/m)) such that a potential difference existing between adjacent electrodes 20 is dropped substantially across the mediator layer 17.

According to the invention, then, in the case of the adaptive mirror 10 in the exemplary embodiment in FIG. 1, the mediator layer 17 is not embodied as a layer that is electrically conductive in a planar continuous fashion. Rather, it is structured to have a plurality of mutually electrically insulated regions 17a, 17b, 17c, . . . . This structuring is realized in the exemplary embodiment—but without the invention being restricted thereto—by the mediator layer 17 being correspondingly structured lithographically during the production of the adaptive mirror 10, wherein electrically insulating material such as e.g. $SiO_2$ or $Al_2O_3$ is introduced between the regions 17a, 17b, 17c, . . . , which are separated from one another during said structuring. The electrically insulating sections for separating the individual regions 17a, 17b, 17c, . . . of the mediator layer 17 from one another are designated by "25" in FIG. 1. In further embodiments, said structuring of the mediator layer 17 can also be carried out e.g. using laser ablation.

According to the invention, the above-described structuring of the mediator layer 17 then has the effect, in particular, that a mediation in terms of electrical potential between electrodes 20 of the electrode arrangement assigned to said mediator layer 17 by way of an electric current flow across the mediator layer 17 is no longer effected between all the electrodes 20, but rather only groupwise between those electrodes 20 which are assigned to one and the same region 17a, 17b, 17c, . . . of the mediator layer 17. In this case, depending on the specific configuration of the structuring of the mediator layer 17, the relevant groups or clusters of electrodes 20 can each comprise a partial number of electrodes 20 that is of any desired magnitude.

In particular, the structuring can be effected in such a way that a mediation in terms of electrical potential is effected only between directly adjacent electrodes 20. In further embodiments, said mediation can also be effected over a larger partial number of electrodes 20 (also including the respective next neighbours but one or electrodes even further away). Furthermore, in embodiments, the number of electrodes 20 comprised per group or cluster (and mediated in terms of electrical potential in the above sense or assigned to one and the same region 17a, 17b, 17c, . . . of the mediator layer 17) can vary across the entire mediator layer 17 in order, depending on the specific application, to enable the best possible approximation of the deformation profile set by the adaptive mirror 10 to the respective target profile and, in particular, also the setting of deformation profiles that are as "edge-sharp" as possible.

TABLE 1

| Zernike-Polynomial no. | Unstructured Mediator layer | Structured Mediator layer |
|---|---|---|
| 5 | 7.9% | 0.74% |
| 6 | 4.4% | 0.44% |
| 7 | 15.2% | 0.57% |
| 8 | 9.5% | 0.67% |
| 9 | 24.0% | 0.57% |
| 10 | 9.4% | 0.50% |
| 11 | 6.8% | 0.51% |
| 12 | 25.0% | 1.46% |
| 13 | 18.4% | 0.42% |
| 14 | 36.9% | 0.33% |
| 15 | 22.1% | 0.46% |
| 16 | 40.5% | 0.25% |

Figure 3A:
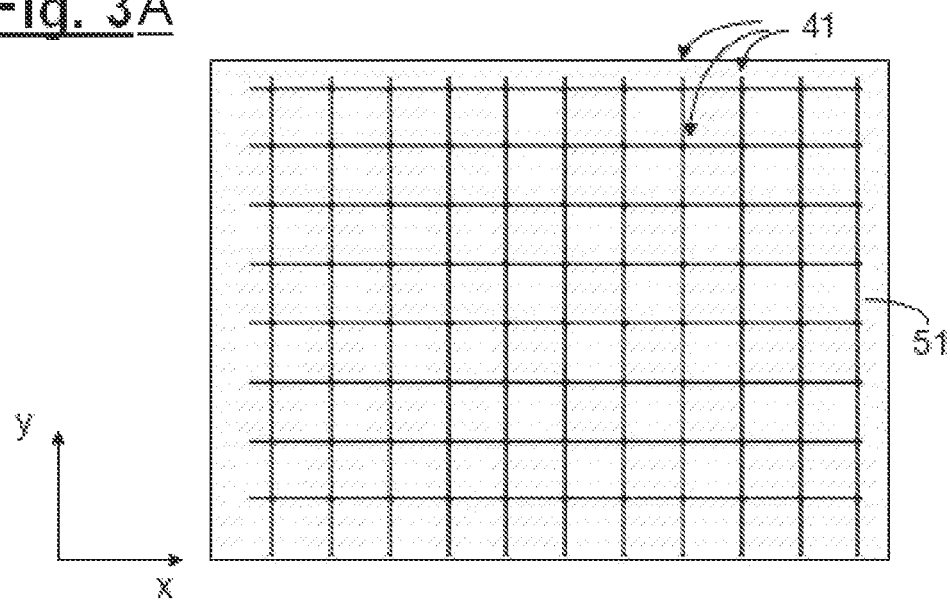
FIGS. 3A-3C show three exemplary realizations of mediator layers with insulating sections and electrodes in adaptive mirrors in accordance with further embodiments of the invention.
Figure 3B:
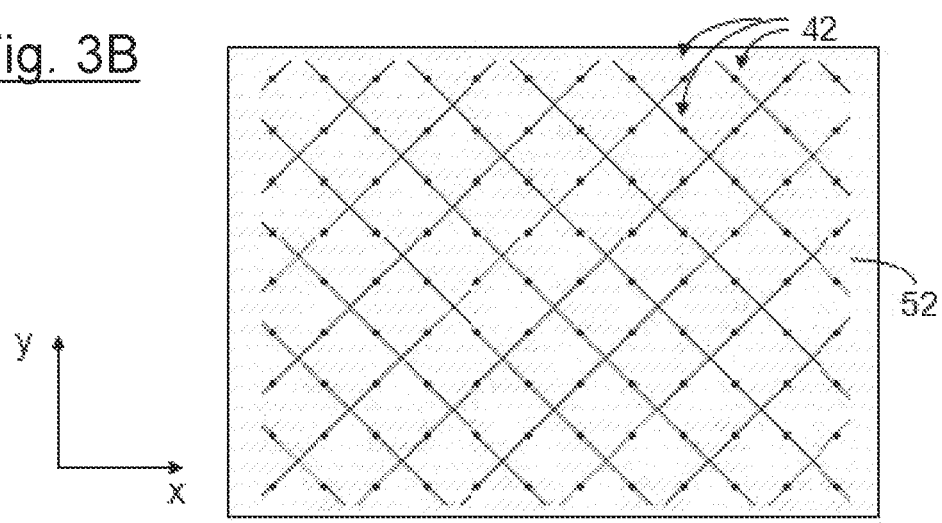
Figure 3C:
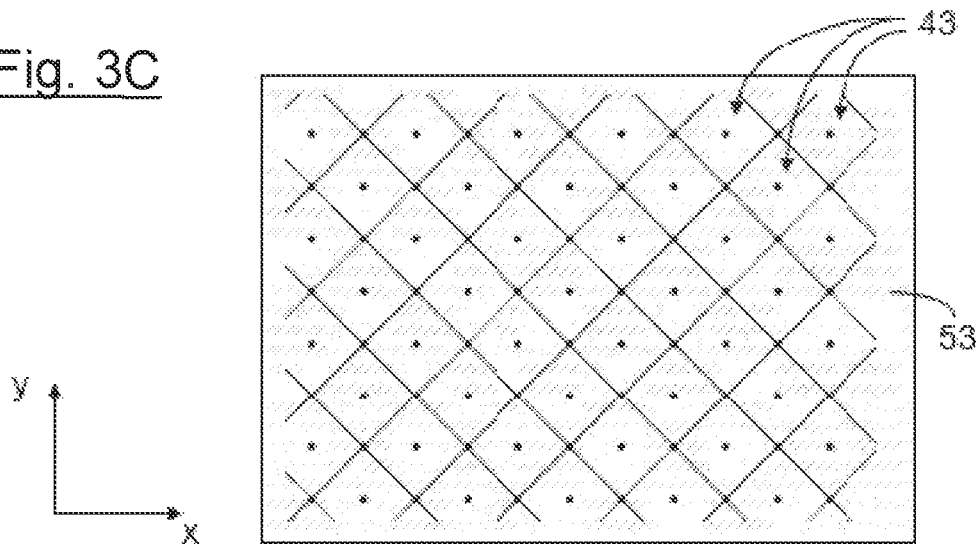
Figure 4B:
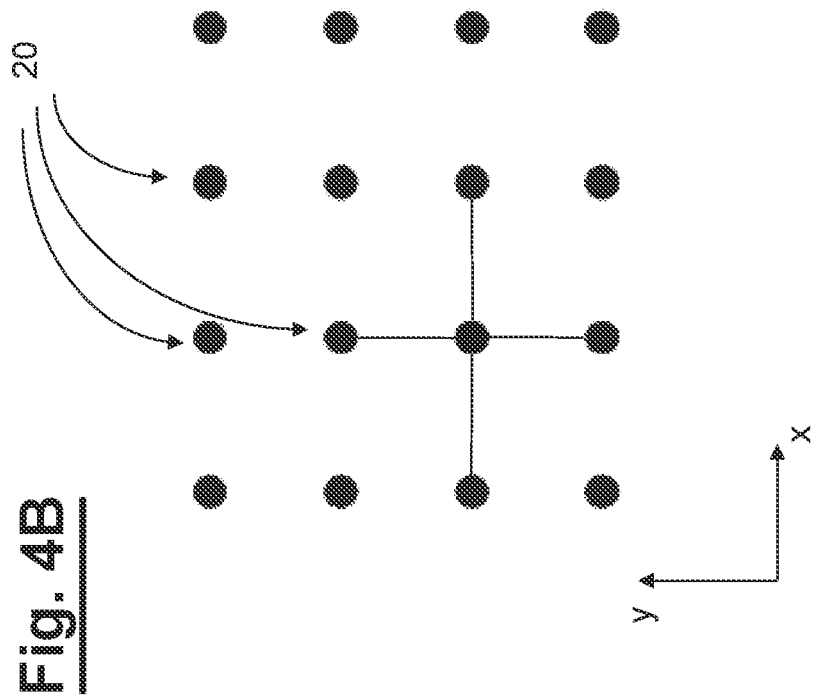
FIGS. 4A and 4B depict the effect of a conventional mediator layer (FIG. 4A) and of an inventive mediator layer (FIG. 4B) on interactions between adjacent electrodes.
Figure 4A:
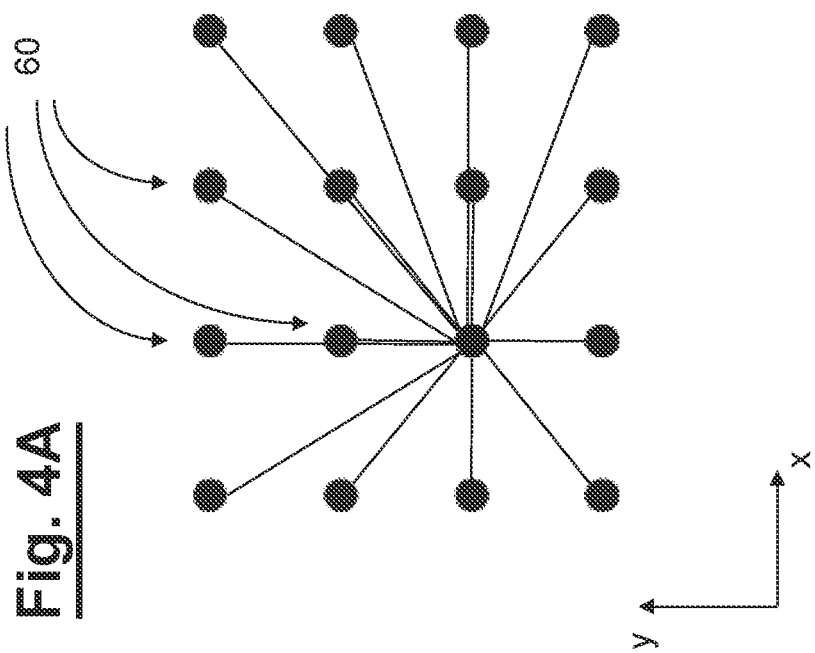

FIGS. 3A-3C show merely exemplary realizations of the structuring according to the invention in a schematic and simplified illustration, wherein the relevant mediator layer is designated respectively by "51", "52" and "53" and wherein the electrodes of the electrode arrangement respectively assigned to said mediator layer are designated by "41", "42" and "43", respectively. The solid black lines in FIGS. 3A-3C correspond in each case to the electrically insulating sections (e.g. formed from $SiO_2$ as described above). The number of electrodes between which an electrical coupling is effected across corresponding regions of the mediator layer is four in each case in accordance with FIG. 3A and FIG. 3B, whereas said number is five in accordance with FIG. 3C. In line with the explanations above, in further embodiments said number can also be chosen to be higher or lower (e.g. three in the case of triangular cells) and arbitrarily in principle.

Figure 2:
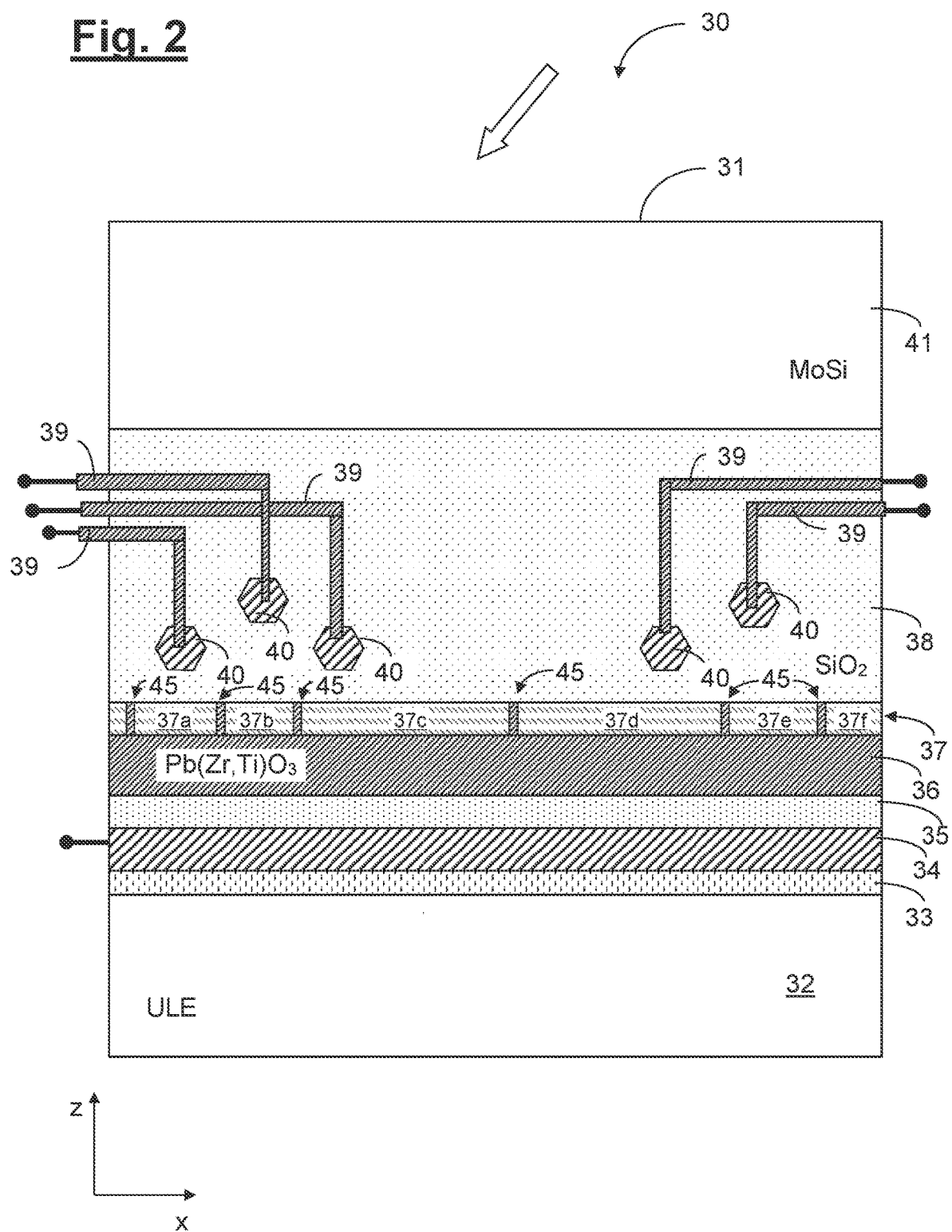
FIG. 2 shows a schematic illustration depicting the construction of a further adaptive mirror in accordance with a further embodiment of the invention.

FIG. 2 shows a further embodiment, wherein components analogous or substantially functionally identical to FIG. 1 are designated by reference numerals increased by "20". In contrast to FIG. 1, in the case of the embodiment in FIG. 2, the structuring of the mediator layer 37 is realized by the piezoelectric layer 36 extending between the regions 37a, 37b, 37c, . . . of the mediator layer 37 that are to be electrically insulated from one another, that is to say that the material of the piezoelectric layer 36 itself serves as an electrical insulator. This can be realized during the production of the adaptive mirror 30 e.g. by virtue of the fact that, after the piezoelectric layer 36 has been applied, the material of said piezoelectric layer is partially removed e.g. with the aid of laser ablation and the material of the mediator layer 37 is deposited in the corresponding intermediate regions.

Both in the embodiment in accordance with FIG. 2 and in the embodiment in accordance with FIG. 1, the at least two mutually electrically insulated regions 17a, 17b, 17c, . . . ; 37a, 37b, 37c, . . . of the mediator layer 17; 37 are assigned to the same piezoelectric layer 16; 36, and extend along the piezoelectric layer 16; 36. Also, in both the embodiments according to FIGS. 1 and 2, after the above-described structuring of the mediator layer 17; 37, a CMP step (CMP=chemical mechanical polishing) can be employed in order to ensure a geometry that is as smooth or planar as possible before the further layer sequence is applied.

According to the invention, with regard to the structuring of the mediator layer, an increased outlay is deliberately accepted from a production engineering standpoint in order, in return, by way of the suppression of a remote interaction in the mediation in terms of electrical potential between the electrodes, to achieve an improved approximation of the deformation profile to the target profile desired in each case.

Figure 5:
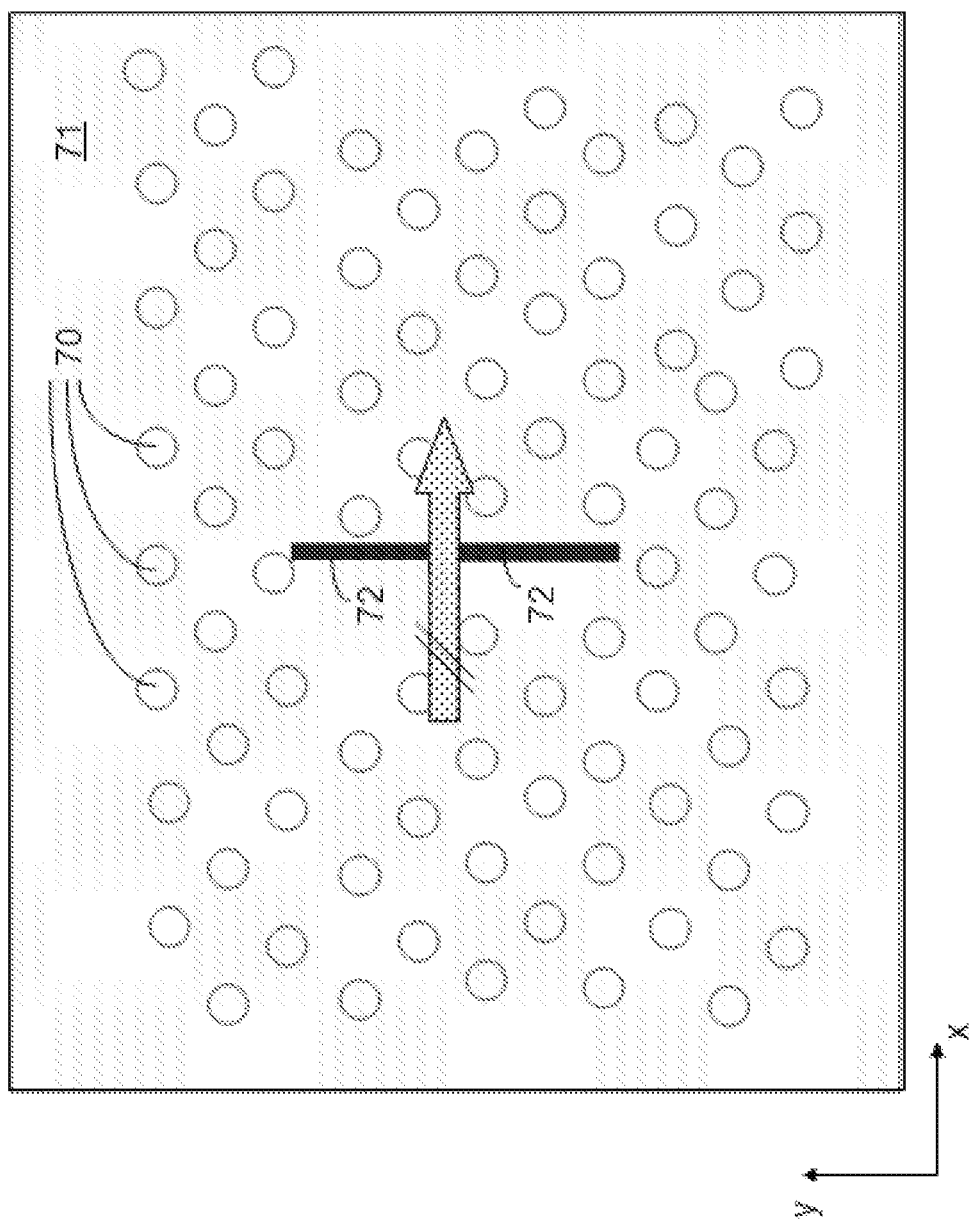
FIG. 5 shows a schematic illustration depicting a mediator layer, electrodes and a shielding electrode in accordance with a further embodiment of the invention.

In further embodiments, (additionally or alternatively) a suppression of said remote interaction in the mediation in terms of electrical potential between the electrodes of the electrode arrangement assigned to the mediator layer can also be attained using one or more shielding electrodes, as is illustrated in a merely schematic and greatly simplified manner in FIG. 5. In this case, the electrodes of the electrode arrangement assigned to a mediator layer 71 (which here is configured in planar continuous fashion, i.e. is not structured) are designated by "70" and a corresponding shielding electrode is designated by "72". Optionally, a defined electrical voltage can be applied to said shielding electrode 72 or else the latter can be operated with zero voltage. As indicated by means of the scored-through horizontal arrow in FIG. 5, the effect of the shielding electrode 72 is, in particular, to suppress an electric current flow between electrodes 70 arranged on different sides of the shielding electrode 72. In this case, the shielding electrode 72 is situated in the same plane as the electrodes 70 (i.e.—in contrast to the electrically insulating sections 25 and 45 described with reference to FIG. 1 and FIG. 2, respectively—not in the plane of the mediator layer).

In particular, the shielding electrodes can also be embodied as an almost closed curve ("almost" in order to still enable the inner electrodes to be contacted) in order thereby to attain a very high resistance between the inner and outer electrodes.

Figure 6:
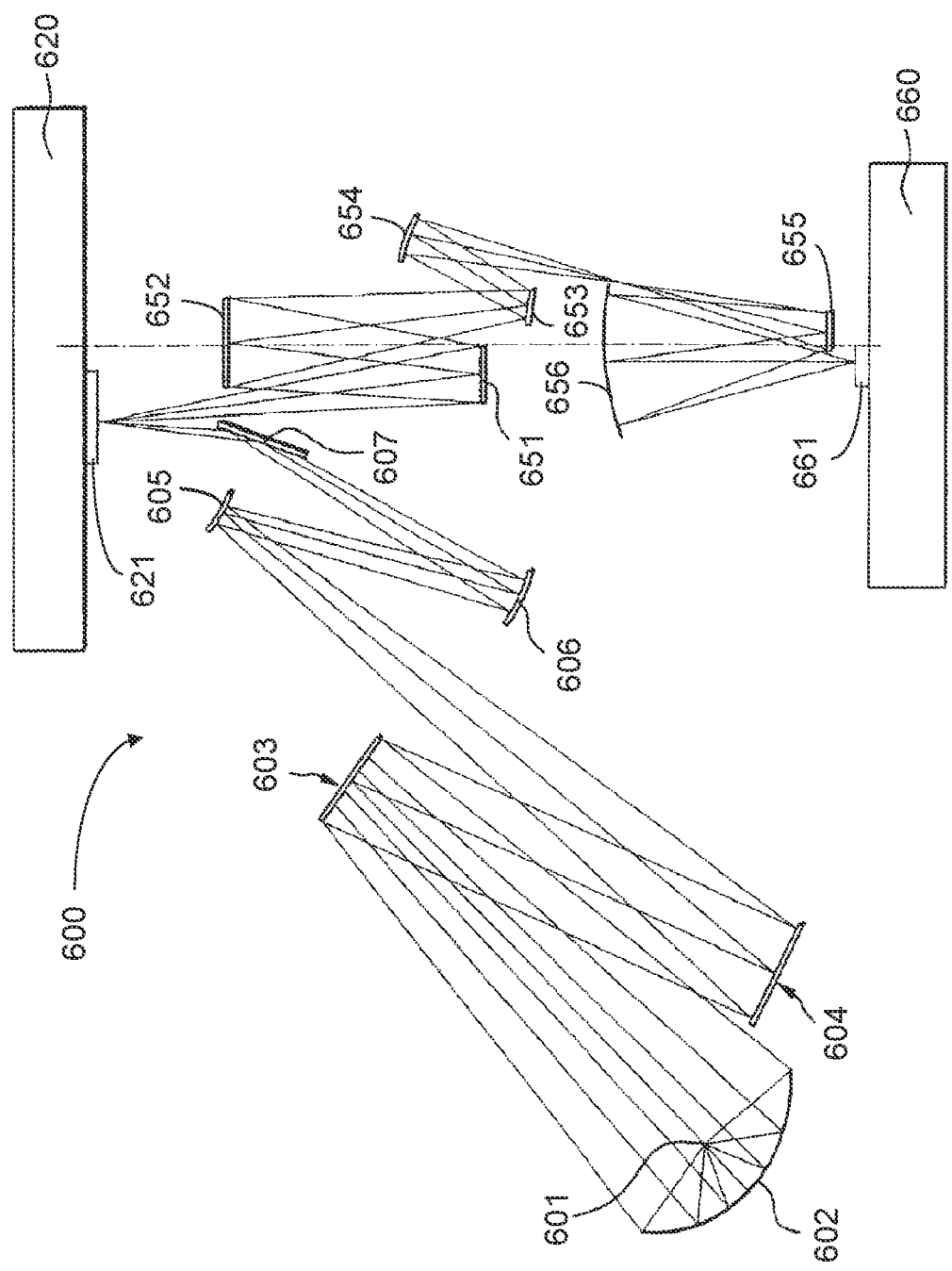
FIG. 6 shows a schematic illustration depicting a possible construction of a microlithographic projection exposure apparatus designed for operation in the EUV.
Figure 8A:
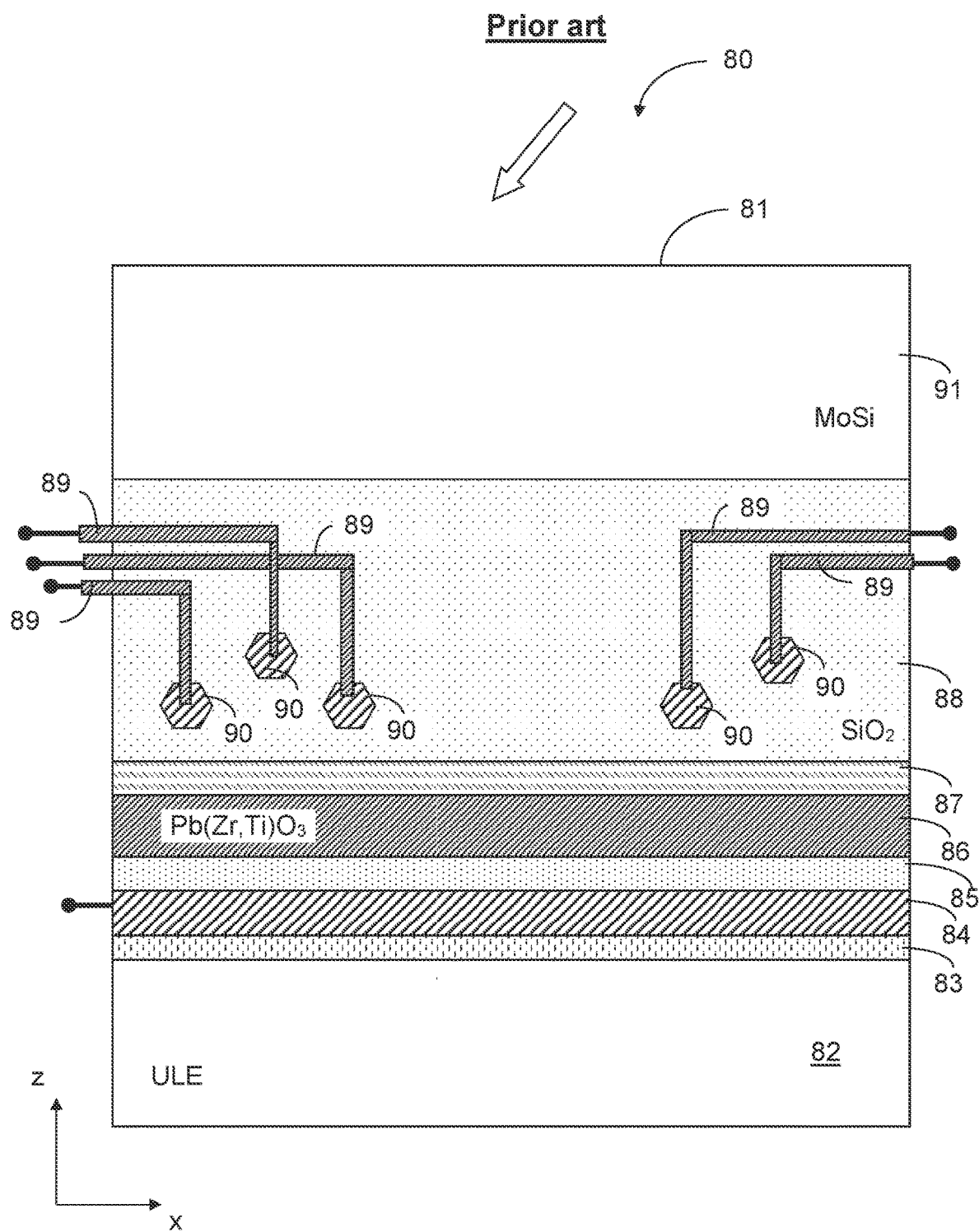
Figure 9:
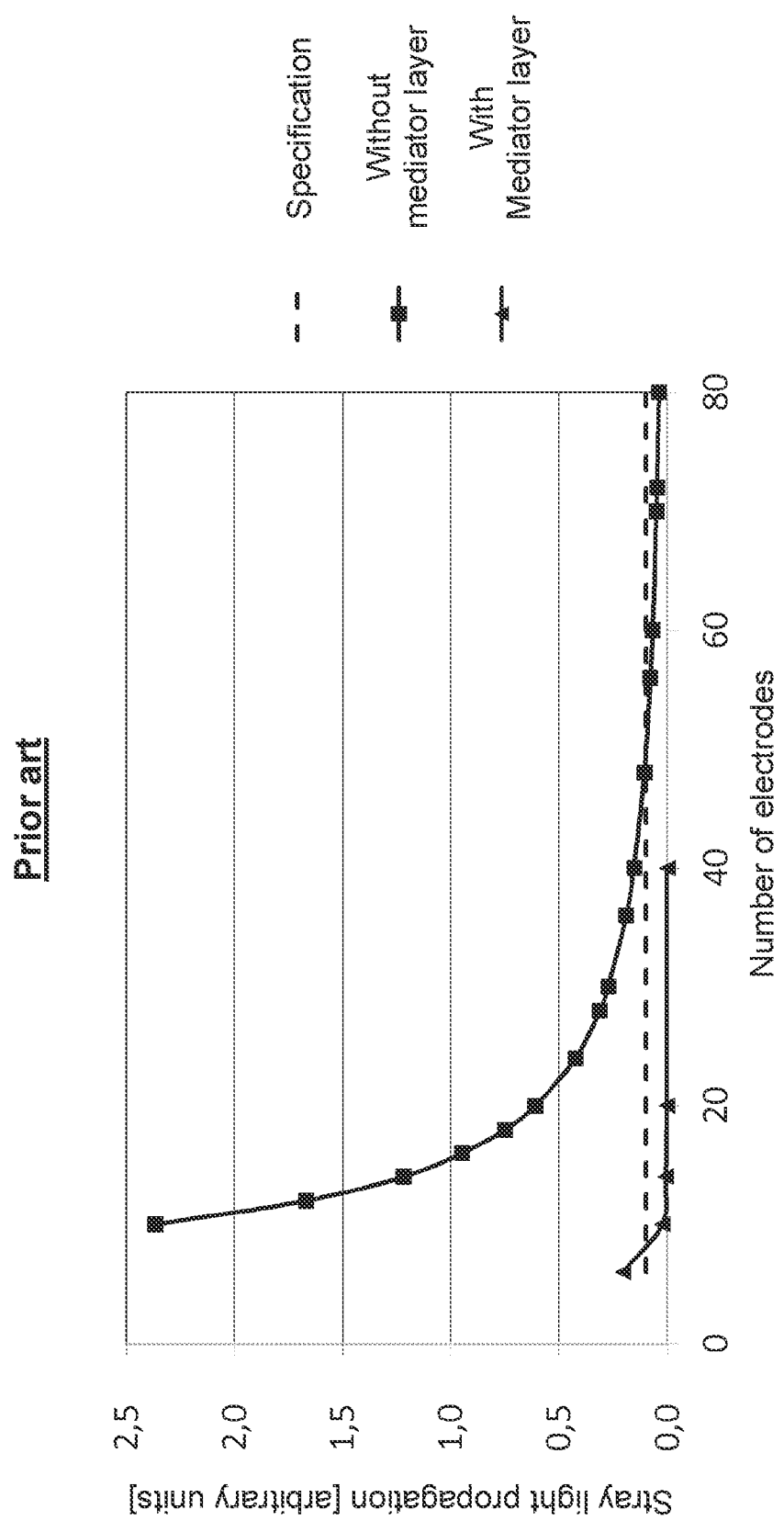
FIG. 9 shows a diagram showing the influence of a mediator layer in a conventional adaptive mirror in accordance with FIGS. 8A-8B.

FIG. 6 shows a schematic illustration of an exemplary projection exposure apparatus which is designed for operation in the EUV and in which the present invention can be realized.

According to FIG. 6, an illumination device in a projection exposure apparatus 600 designed for EUV comprises a field facet mirror 603 and a pupil facet mirror 604. The light from a light source unit comprising a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident thereon onto an object field in the object plane of a projection lens comprising six mirrors 651-656. At the location of the object field, a reflective structure-bearing mask 621 is arranged on a mask stage 620, said mask being imaged with the aid of the projection lens into an image plane in which a substrate 661 coated with a light-sensitive layer (photoresist) is situated on a wafer stage 660.

FIG. 7 shows a construction possible in principle of a microlithographic projection exposure apparatus 700 designed for operation in the VUV. The projection exposure apparatus 700 comprises an illumination device 710 and a projection lens 720. The illumination device 710 serves to illuminate a structure-bearing mask (reticle) 730 with light from a light source unit 701, which for example comprises an ArF excimer laser for an operating wavelength of 193 nm and a beam shaping optical unit producing a parallel light beam. The illumination device 710 comprises an optical unit 711 which, inter alia, comprises a deflection mirror 712 in the depicted example. The optical unit 711 may comprise for example a diffractive optical element (DOE) and a zoom-axicon system for producing different illumination settings (i.e. intensity distributions in a pupil plane of the illumination device 710). A light mixing device (not depicted here) is situated in the beam path downstream of the optical unit 711 in the light propagation direction, which light mixing device may have e.g., in a manner known per se, an arrangement composed of micro-optical elements which is suitable for attaining light mixing, and a lens-element group 713, downstream of which there is a field plane with a reticle masking system (REMA), which is imaged by a REMA lens 714, disposed downstream in the light propagation direction, onto the structure-bearing mask (reticle) 730 arranged in a further field plane and which thereby delimits the illuminated region on the reticle.

With the projection lens 720, the structure-bearing mask 730 is imaged onto a substrate provided with a light-sensitive layer (photoresist) or onto a wafer 740. In particular, the projection lens 720 may be designed for immersion operation, in which case an immersion medium is situated upstream of the wafer, or the light-sensitive layer thereof, in relation to the light propagation direction. Further, it may have for example a numerical aperture NA greater than 0.85, in particular greater than 1.1.

In principle, any desired mirror of the projection exposure apparatus 600 and 700 described with reference to FIG. 6 and FIG. 7, respectively, can be configured as an adaptive mirror in the manner according to the invention.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and the equivalents thereof.

What is claimed is:

1. Mirror having an optical effective surface, comprising:
a mirror substrate;
a reflection layer system that reflects electromagnetic radiation incident on the optical effective surface;
at least one piezoelectric layer, arranged between the mirror substrate and the reflection layer system; and
a first electrode arrangement situated on a side of the piezoelectric layer facing the reflection layer system, and a second electrode arrangement situated on a side of the piezoelectric layer facing the mirror substrate;
wherein the first electrode arrangement and the second electrode arrangement are arranged to apply an electric field to the piezoelectric layer that produces a locally variable deformation in the piezoelectric layer;
wherein one of the electrode arrangements is assigned a mediator layer having an electrical conductivity less than 200 siemens/meter that sets an at least regionally continuous electrical potential profile along the respective electrode arrangement; and
wherein the mediator layer has at least two mutually electrically insulated regions, wherein the mutually electrically insulated regions of the mediator layer extend along the piezoelectric layer.

2. Mirror according to claim 1, wherein the electrode arrangement to which the mediator layer is assigned has a plurality of electrodes, each of which is structured to have an electrical voltage relative to the respective other electrode arrangement applied via a lead.

3. Mirror according to claim 2, wherein the mediator layer is structured to provide a plurality of mutually electrically insulated regions, wherein said the respective regions are assigned to different electrodes or to different clusters of the electrodes.

4. Mirror according to claim 3, wherein the structuring makes possible an electric current flow across the mediator layer only between directly adjacent electrodes.

5. Mirror according to claim 3, wherein the structuring makes possible an electric current flow across the mediator layer only between electrodes respectively associated with a same cluster.

6. Mirror according to claim 5, wherein the number of electrodes in the respective clusters varies across the mediator layer.

7. Mirror according to claim 3, further comprising a shielding electrode that at least partly shields the respective electrical potentials arranged between different ones of the electrodes or different ones of the clusters of the electrodes.

8. Mirror according to claim 7, wherein the shielding electrode is provided with a defined electrical voltage or is operated with zero voltage.

9. Mirror according to claim 1, wherein the mutually electrically insulated regions of the mediator layer are separated from one another by an electrically insulating material situated between the regions.

10. Mirror according to claim 9, wherein the electrically insulating material situated between the regions comprises silicon dioxide ($SiO_2$) or $Al_2O_3$.

11. Mirror according to claim 1, wherein the mutually electrically insulated regions of the mediator layer are separated from one another by a material having an electrical permittivity $\varepsilon_r$ of more than 1000.

12. Mirror according to claim 1, wherein the piezoelectric layer extends between the mutually electrically insulated regions of the mediator layer.

13. Mirror according to claim 1, wherein electrically insulating sections separate the mutually electrically insulated regions and have a maximum dimension of less than 10 μm in a plane parallel to the piezoelectric layer.

14. Mirror according to claim 1, wherein the material of the mediator layer is selected from the group consisting essentially of titanium oxides, gallium nitrides, gallium oxides, aluminium nitrides, aluminium oxides and also mixed oxides comprising lanthanum (La), manganese (Mn), cobalt (Co), calcium (Ca), strontium (Sr), iron (Fe), copper (Cu) or nickel (Ni).

15. Mirror according to claim 1, wherein the mirror is configured for an operating wavelength of less than 30 nm.

16. Mirror according to claim 1, configured to produce a locally variable deformation in response to an electric field applied to the piezoelectric layer, wherein a maximum deviation of the deformation from a predefined desired profile is less than 2%.

17. Mirror according to claim 1, wherein a distance between an optically used surface of the mirror and an edge of the mirror is less than 10 mm.

18. Mirror according to claim 1, wherein the mediator layer has an average electrical sheet resistance of less than 10 kΩ.

19. Optical system configured as an illumination device or a projection lens in a microlithographic projection exposure apparatus and comprising a mirror according to claim 1.

20. Mirror having an optical effective surface, comprising:
- a mirror substrate;
- a reflection layer system that reflects electromagnetic radiation incident on the optical effective surface;
- at least one piezoelectric layer, arranged between the mirror substrate and the reflection layer system; and
- a first electrode arrangement situated on a side of the piezoelectric layer facing the reflection layer system, and a second electrode arrangement situated on a side of the piezoelectric layer facing the mirror substrate;
- wherein the first electrode arrangement and the second electrode arrangement are arranged to apply an electric field to the piezoelectric layer that produces a locally variable deformation in the piezoelectric layer;
- wherein one of the electrode arrangements is assigned a mediator layer having an electrical conductivity less than 200 siemens/meter that sets an at least regionally continuous electrical potential profile along the respective electrode arrangement;
- wherein the electrode arrangement to which the mediator layer is assigned has a plurality of electrodes, each of which is structured to have an electrical voltage relative to the respective other electrode arrangement applied via a lead; and
- a shielding electrode that at least partly shields the respective electrical potentials arranged between different ones of the electrodes or different ones of the clusters of the electrodes.

21. Method for producing a mirror, comprising:
providing a mirror substrate;
applying a piezoelectric layer and also a first and a second electrode arrangement on the mirror substrate;
situating the first electrode arrangement on a side of the piezoelectric layer that faces away from the mirror substrate, and situating the second electrode arrangement on a side of the piezoelectric layer that faces the mirror substrate;
applying a mediator having an electrical conductivity less than 200 siemens/meter that sets an at least regionally continuous electrical potential profile along one of the electrode arrangements such that the mediator layer has at least two mutually electrically insulated regions, wherein the mutually electrically insulated regions of the mediator layer extend along the piezoelectric layer;
applying a reflection layer stack configured to reflect electromagnetic radiation having an operating wavelength that is incident on an optical effective surface of the mirror; and
applying an electric field that produces a locally variable deformation to the piezoelectric layer by way of the first electrode arrangement and the second electrode arrangement.

22. Method according to claim 21, wherein said applying the mediator layer comprises structuring the mediator layer lithographically or using laser ablation.

* * * * *